United States Patent
Dijkstra et al.

(10) Patent No.: US 11,243,239 B2
(45) Date of Patent: Feb. 8, 2022

(54) PROBE WITH ANTENNA

(71) Applicant: DARE!! B.V., Woerden (NL)

(72) Inventors: Patrick Walter Joseph Dijkstra, Driebruggen (NL); Antonius Josephus Van Peer, Vleuten (NL)

(73) Assignee: INPACARE B.V., Woerden (NL)

( * ) Notice: Subject to any disclaimer, the term of this patent is extended or adjusted under 35 U.S.C. 154(b) by 207 days.

(21) Appl. No.: 16/352,479

(22) Filed: Mar. 13, 2019

(65) Prior Publication Data
US 2019/0285677 A1     Sep. 19, 2019

(30) Foreign Application Priority Data

Mar. 14, 2018 (NL) ........................................ 020586

(51) Int. Cl.
*G01R 29/08* (2006.01)
*G01R 35/00* (2006.01)
*G01R 31/00* (2006.01)

(52) U.S. Cl.
CPC ..... *G01R 29/0885* (2013.01); *G01R 29/0878* (2013.01); *G01R 29/0892* (2013.01); *G01R 35/005* (2013.01); *G01R 31/001* (2013.01)

(58) Field of Classification Search
CPC ............ G01R 29/0885; G01R 29/0878; G01R 35/005; G01R 29/0892; G01R 31/001
See application file for complete search history.

(56) References Cited

U.S. PATENT DOCUMENTS

| 2005/0073302 A1* | 4/2005 | Hibbs | A61B 5/24 324/247 |
| 2007/0134615 A1* | 6/2007 | Lovely | A61B 5/0086 433/29 |
| 2014/0172337 A1* | 6/2014 | Kern | G01D 5/142 702/65 |

(Continued)

FOREIGN PATENT DOCUMENTS

| FR | 2750209 A1 | 12/1997 |
| WO | 0146705 A1 | 6/2001 |

(Continued)

OTHER PUBLICATIONS

International Search Report and Written Opinion for the International Patent Application No. NL2020586, dated Nov. 8, 2018.

*Primary Examiner* — Alvaro E Fortich
*Assistant Examiner* — Zannatul Ferdous
(74) *Attorney, Agent, or Firm* — Kacvinsky Daisak Bluni PLLC

(57) ABSTRACT

A probe for measuring an electrical field includes at least three antennas, each antenna being adapted to receive a RF signal. The at least three antennas are arranged in accordance with three axes oriented perpendicularly to each other. A detection circuit is provided for each antenna, connected to the corresponding antenna for detecting an RF signal. A processing circuit is operationally connected to an output of each detection circuit for processing the detected signals and outputting a measurement result. A measurement correction mechanism is provided for correcting the measurement result based on a frequency of said electrical field and an angular position of the probe relative to said electrical field.

17 Claims, 5 Drawing Sheets

(56) References Cited

U.S. PATENT DOCUMENTS

2016/0091533 A1* 3/2016 Soleillant .............. G01R 15/18
              324/127
2018/0023977 A1* 1/2018 Park ...................... G01D 5/145
              324/207.2
2018/0102627 A1* 4/2018 Parker .................. H01S 5/0085

FOREIGN PATENT DOCUMENTS

WO        2009020388  A1     2/2009
WO    WO-2009020388  A1 *   2/2009    ......... G01R 29/0878

* cited by examiner

PROBE WITH ANTENNA

CROSS-REFERENCE TO RELATED APPLICATION

This is a United States Nonprovisional application claiming priority to Netherlands patent application no. NL 2020586, filed Mar. 14, 2018, the entirety of which application is incorporated by reference herein.

FIELD

The present invention relates to probe systems, and in particular to a probe or sensor for measuring an electrical field, comprising at least one antenna, a detection circuit for each antenna, which detection circuit is connected to the corresponding antenna for detecting an RF signal, and a processing unit for processing the detected signal.

BACKGROUND

Such probes are also known as field probes which are typically used to RF fields for all manner of applications, such as measuring the electrical field strength during testing of radiation immunity, calibration of the electrical field in test arrangements, determining the homogeneity of the electrical field in a test installation or measuring the electrical field strength in order to determine whether the field levels lie below a value acceptable for persons.

The known field probes typically use a number of antenna elements and circuit for converting the RF signal into a DC current with an amplitude which is a function of the amplitude of the RF signal. It is desirable that such probes operate properly, and in particular are isotropic in a wide frequency and amplitude range.

Such a probe is for instance described in WO 2009/020388. The probe described therein has three antenna subsystems which are oriented along respectively an X, Y and Z axis. The antenna elements are connected to a detection/filter circuit, from where the detected signals are transmitted to a processing circuit connected to a power supply and communication circuit, from where optical data signals are sent via an optical fiber for further processing, for instance on a PC. This probe comprises three monopole antennas. Each antenna is connected to a housing with a substantially spherical surface for forming a ground plane. The antennas and at least a part of the detection system is arranged outside the housing while the processing circuit is arranged inside the housing. The advantage of such set-up is that interference between the housing, the antenna, the RF signal and the processing elements can be minimized. This significantly improves the reliability of the measurement.

SUMMARY

It is an object of embodiments of the invention to increase the accuracy of the measurement.

According to a first aspect the invention relates to a probe system for measuring an electrical field, comprising at least three sensing means arranged in accordance with at least three non-coplanar axes such that three electrical field components along said three non-coplanar axes can be sensed. Each sensing means is adapted to sense an electric field component of an RF signal and to output an electric signal which is a measure for said sensed electric field component. The probe system further comprises a processing circuit operationally connected to each sensing means. The processing circuit is configured for processing the obtained electric signals and for outputting a measurement result. The probe system further comprises a measurement correction mechanism for correcting the measurement result based on a frequency of said electrical field and an angular position of the at least three sensing means relative to said electrical field.

Embodiments are based on the insight that the angular position of the probe relative to the electrical field influences the measurement result despite the three non-coplanar axes. However, embodiments of the invention are based on the further insight that the measurement error is predictable based on the angular position of the sensing means relative to the electrical field, and that the error changes when the frequency changes. Therefore, by applying a correction mechanism for correcting the measurement result based on a frequency of the electrical field and an angular position of the sensing means relative to the electrical field, the accuracy of the measurement is improved. The isotropic nature of the probe system may be maintained, meaning that the probe can be oriented relative to the electrical field in any desired position while the measurement result and the output of the probe system is improved and is made more accurate by correcting a known error that is related to the frequency of the electrical field and the angular position relative to the electrical field.

Preferably, each sensing means is adapted to output an electric signal representative for an amplitude of the sensed electrical field component, and wherein the measurement correction mechanism is configured to use an angular position which is determined based on the at least three electric signals representative for the at least three detected amplitudes output by the at least three sensing means.

According to a second aspect, the invention provides a probe for measuring an electrical field, comprising:
  at least three antennas, each antenna being adapted to receive an RF signal, preferably in a broadband range, the at least three antennas being arranged in accordance with three non-coplanar axes;
  a detection circuit for each antenna, connected to the corresponding antenna for detecting an RF signal; and
  a processing circuit operationally connected to an output of each detection circuit for processing the detected signals and outputting a measurement result;
  a measurement correction mechanism for correcting the measurement result based on a frequency of said electrical field and an angular position of the probe relative to said electrical field.

To obtain an accurate measurement of the electrical field, the isotropic nature of the probe is important. Therefore, the probe is provided with at least three antennas arranged in accordance to three non-coplanar axes, preferably axes oriented perpendicularly to each other. The direct result is that electrical fields can have different orientations or points of origin, with respect to the probe, while the probe keeps measuring the electrical field with the at least three antennas. The skilled person will understand that with only a single antenna it is impossible to measure all randomly oriented electrical fields. However, with three non-coplanar antennas, preferably perpendicular to each other, there is always at least one antennas which will be able to measure the electrical field. The isotropic nature of the probe increases the accuracy, usability and user friendliness of the probe. Due to the isotropic nature, the orientation of the probe with respect to the source of the electrical field is not critical for being able to measure the electrical field.

Embodiments of the present invention are based on the insight that the angular position of the probe relative to the electrical field influences the measurement result despite the three antennas and the isotropic nature of the probe. However, embodiments are based on the further insight that the measurement error is predictable based on the angular position of the probe relative to the electrical field. Embodiments are further based on the insight that the error changes when the frequency changes. Therefore, by applying a correction mechanism for correcting the measurement result based on a frequency of the electrical field and an angular position of the probe relative to the electrical field, the accuracy of the measurement is improved. The isotropic nature of the probe is maintained, meaning that the probe can be oriented relative to the electrical field in any desired position while the measurement result and the output of the probe is improved and is made more accurate by correcting a known error that is related to the frequency of the electrical field and the angular position of the probe relative to the field.

In this context, the skilled person will understand that multiple frequencies can be emitted by a source and/or received by the antennas. In such case, the frequency having the highest amplitude will be used to as frequency of the electrical field. When a frequency range is emitted, for example a narrow frequency band, any frequency of the band, preferably the center frequency of the band can be used as frequency of the electrical field.

Preferably, the probe comprises an input for receiving information relating to the frequency. The probe is typically used in testing environments, for example EMC tests which are described hereunder. In such testing environments, an electrical field is generated by a source. Typically, this source generates an electrical field having a known amplitude and a known frequency. This frequency is fed to an input of the probe. In a first embodiment, an operator can manually enter the frequency into a user interface of the probe. Alternatively, the RF signal is fed as an analogue signal to an interface which is related to the probe, which interface is able to measure the frequency of the RF signal, which frequency can be further used by the probe. The frequency can be signaled to the control software of the probe. Alternatively, and preferably, the input is adapted to be operationally connected to the source for said electrical field. By operationally connecting the input to the source for the electrical field, information regarding a frequency can be received by the probe from the source. This frequency can be delivered in the form of information relating to the RF signal via a communication link between the source and the probe.

Preferably, each detection circuit is adapted to detect an amplitude related to the electrical field, received by the corresponding antenna. Further preferably, the angular position is determined based on the ratio of the three detected amplitudes corresponding to the three antennas arranged in accordance with the three axes oriented perpendicular to each other. The ratio between the amplitudes of the three antennas can be used as a base for determining an angular position of the probe relative to the electrical field. In other words, the ratio of the amplitudes allows to calculate an axis crossing a center of the probe on which axis the source of the electrical field is expected to be located. This relieves an operator from positioning and orienting the probe relative to the source of the electromagnetic field in a predetermined manner. The probe can automatically determine its angular orientation relative to the source of the electrical field.

Preferably, the probe comprises a memory storing a predetermined correction for the measurement result. The predetermined correction can be stored in the different forms, for example in the form of an algorithm and in the form of a mathematical formula. Using such algorithm or formula, a correction value can be calculated using the frequency and angular position as input.

Preferably, the predetermined correction is stored in a look-up table wherein multiple predetermined corrections are stored for different combinations of the frequency and the angular position. The look-up table is preferably created based on tests conducted in a laboratory environment wherein the angular position of the probe relative to the source of the electrical field is known and wherein the amplitude of the electrical field is known as well as the frequency. In such context a standard error can be measured for multiple combinations of a frequency and an angular position. These errors can be stored in a look-up table in a memory of the probe, so that measurement results can be corrected using the predetermined corrections. The skilled person will understand that interpolation and/or extrapolation techniques can be used to improve the correction value using discrete correction values in a look-up table.

In embodiments according to the first aspect each sensing means may comprises an electro-optical probe-element configured for generating an optical signal which is modulated in function of the sensed electrical field component, and a converter configured for converting the optical signal in an electrical signal which is a measure for said sensed electric field component. Each electro-optical probe-element may comprise a crystal having an optical property, e.g. a refractive index, which is dependent on the electrical field, and an optical system (e.g. including a light source and one or more optical elements) configured for generating an optical beam through the crystal in order to obtain an optical signal which is modulated in function of the sensed electrical field component. The converter associated with the electro-optical probe-element may then convert the modulated optical signal in an electrical signal which is a measure for the sensed electric field component. The processing means may then process the electrical signals as described for various embodiment above.

According to a further aspect there is provided a method for measuring an electrical field, comprising the steps of:
sensing an RF signal by at least three sensing means (2) arranged in accordance with at least three non-coplanar axes such that at least three electrical field components along said at least three non-coplanar axes are sensed; and outputting electric signals which are measures for said sensed at least three electric field components;
processing the obtained electric signals and outputting a measurement result;
correcting the measurement result based on a frequency of said electrical field and an angular position of the at least three sensing means relative to said electrical field.

Preferably, the outputting comprises each sensing means outputting an electric signal representative for an amplitude of the sensed electrical field component, and wherein the correcting uses an angular position which is determined based on the at least three electric signals representative for the at least three detected amplitudes output by the at least three sensing means.

According to yet another aspect the invention relates to a method for measuring an electrical field via a probe, the method comprising:

receiving an RF signal by at least three antennas being arranged in accordance with three axes oriented perpendicularly of each other;

detecting an RF signal corresponding to each of the antennas;

processing the detected signals by a processing circuit to output a measurement result;

correcting the measurement result based on a frequency of said electrical field and an angular position of the probe relative to said electrical field.

Using the method of embodiments of the invention, the isotropic nature of the probe is improved, and the accuracy of the measurement is increased. The RF signal can be a broadband and/or narrowband signal. The three antennas can be chosen as broadband antennas which are able to receive frequencies in a wide range. In use, usually an RF signal is generated by a source, and received by the antennas, based on a single frequency. Such RF signal is very narrowband. Since the antennas are adapted to receive frequencies in a wide range of bands, the antenna is defined as a broadband antenna.

Preferably, the method further comprises information relating to the frequency via an input. Preferably, the information frequency is received via an input which is operationally connected, directly or indirectly, to a source for the electrical field. This simplifies the method for an operator. Furthermore, this simplifies the electronics in the probe as the frequency, when signaled to the probe in the form of information relating to the RF signal, should not be measured by the probe.

Preferably, the step of detecting an RF signal comprises detecting an amplitude relating to the electrical field received by the corresponding antenna. An amplitude can be detecting using simple electronic circuits with high accuracy.

Preferably, the method further comprises determining the angular position based on the ratio of the three detected amplitudes corresponding to the three antennas arranged in accordance with the three axes oriented perpendicular to each other. This allows to determine the orientation of the probe relative to the electrical field using information that is available in the probe. The amplitudes detected by the antennas are determined by the detection circuits. These amplitudes can be used as a basis for determining or calculating the orientation of the probe relative to the electrical field.

Preferably, the method further comprises retrieving a predetermined correction from a memory. Further preferably, the retrieving comprises selecting from a look-up table from multiple corresponding corrections said predetermined correction based on said frequency and the angular position. The look-up table provides an easy and straightforward manner to implement a correction mechanism. The look-up table can be created via tests in a laboratory environment or can be determined by calculation.

Preferably, the at least one antenna is a monopole antenna with a resistivity of at least 100 Ohm, preferably at least 200 Ohm, most preferably about $120\pi$ Ohm. The resistivity has as a result that resonance is less likely to occur since the resistive character of the antenna will reduce the resonance.

Preferably, the at least three antennas comprise six antennas provided in pairs arranged on opposite sides of the housing such that the pairs are arranged on the housing in accordance with three axes oriented perpendicularly of each other. Six antennas further improve the isotropic nature of the probe.

BRIEF DESCRIPTION OF THE DRAWINGS

The invention will now be described in more details with respect to the drawings illustrating some preferred embodiments of the invention. In the drawings.

In the drawings a same reference number has been allocated to a same or analogous element.

DETAILED DESCRIPTION

The probe of embodiments of the invention is primarily developed for use in electromagnetic compatibility (EMC) immunity testing. The skilled person will realize that the probe could also be used for other purposes. At present, during electromagnetic compatibility (EMC) immunity testing, at the emitting side, a signal generator, a high power RF amplifier, and a broadband antenna are used to generate a broadband RF field, typically in an EMC room such as an anechoic chamber, a Faraday cage or a mode stirred chamber. These systems most commonly are used in the frequency ranges of 30 MHz to 1 GHz, 1 GHz to 6 GHz and 1 GHz to 18 GHz. More generally, any range between 20 MHz and 40 GHz can be used. In such a system typically the high power RF amplifier is located outside the EMC room and the broadband antenna is located inside the room.

In the context of the present application broadband refers to an operable range covering at least the range relevant in EMC testing. In other words, according to embodiments of the invention e.g. the operable range of the antenna is preferably about 9 kHz-6 GHz. The lower border of the operable range of the broadband antenna is preferably lower than 25 kHz, more preferably lower than 15 kHz, most preferably lower than 10 kHz. The upper border of the operable range of the broadband antenna is preferably higher than 6 GHz, more preferably higher than 18 GHz, most preferably higher than 30 GHz. In use, usually an RF signal is generated by a source, and received by the antennas, based on a single frequency. Such RF signal is very narrowband. Since the antennas are adapted to receive frequencies in a wide range of bands, the antenna is defined as a broadband antenna.

Figure 1A:
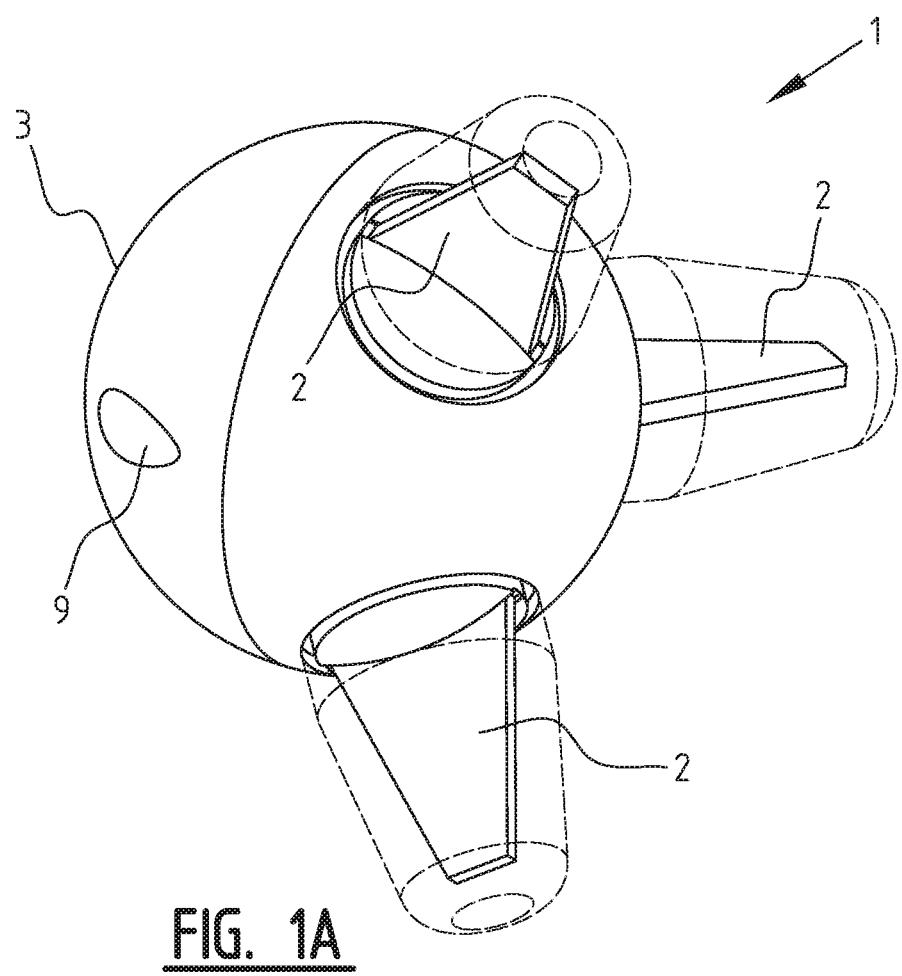
FIG. 1A illustrates a first embodiment of a probe.

In the embodiment illustrated in FIG. 1A the housing 3 is constructed of two substantially spherical parts 19, 20 which are manufactured from a conductive material, typically a metal, and preferably optionally gilded brass. Three monopole antennas 2 are arranged on a first part 19 of the housing in an X, Y and Z direction of an orthogonal coordinate system. Each antenna is enclosed by a protective cap 21 typically manufactured from a material with a low dielectric constant and a low tan δ, such as HMP (high-molecular polyethylene).

Note that it is particularly important that the outer surface around antennas 2 is substantially spherical and that the other part of the housing can also take a different form, wherein the dimensions of the antenna must preferably be small relative to those of the ground plane formed by the outer surface of the housing around each antenna.

Figure 1B:
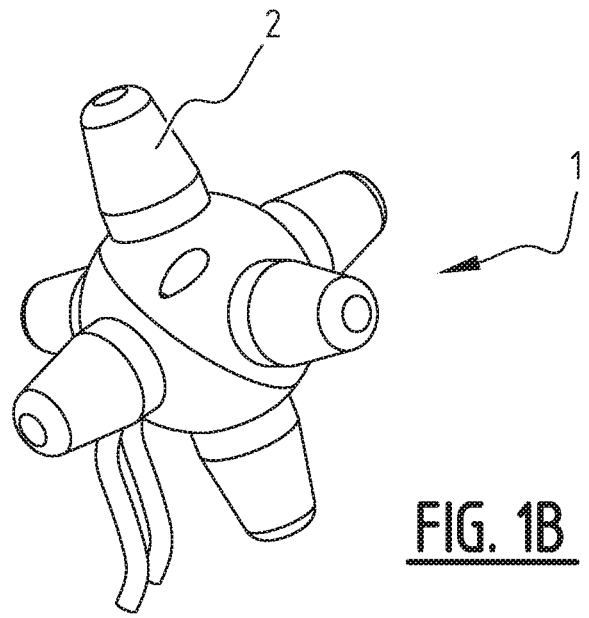
FIG. 1B illustrates a second embodiment of a probe.

FIG. 1B shows an antenna with a further improved isotropy. The probe of FIG. 1B comprises 6 antennas arranged in pairs on the X, Y and Z directions of the orthogonal coordinate system.

Owing to such a mounting of the monopole elements on the housing the parasitic pick-up of fields behind the detector circuit before the DC signal is fed into the Faraday cage is limited to a minimum, this enhancing the accuracy of the probe. Very weak signals can thus also be detected. Furthermore, the symmetrical construction results in a probe with good isotropic properties. However, despite the symmetrical construction, reflections of the electrical field may occur from the housing towards one or multiple of the antennas. These reflections influence the measurement result of the antenna.

Figure 2:
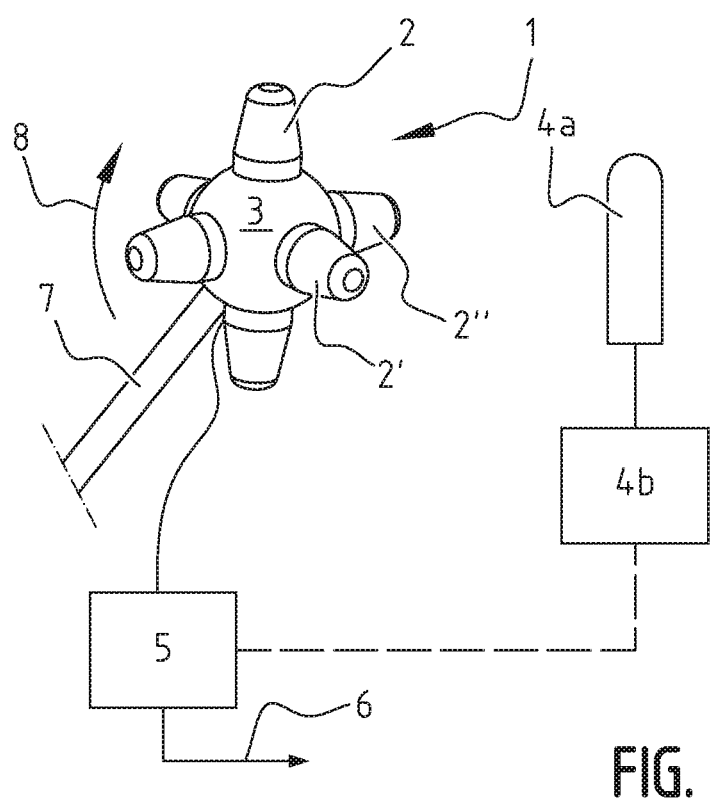
FIG. 2 schematically illustrates a probe in a laboratory environment for determining a relation between a measurement correction and an angular position and frequency.

FIG. 2 illustrates an embodiment of a set-up wherein a probe 1 and an RF signal source 4 can be arranged in a test setting or a laboratory setting to determine the correction value. This determined correction value can be used in for example EMC testing or other measurements where an accurate measurement output is desired. Using this setting, the lookup table or algorithm to determine the correction can be generated.

In particular, FIG. 2 shows a probe 1 which is mounted on a shaft 7 that is positioned to make a magic angle rotation 8. A magic angle rotation 8 is known, and relates to the rotation that is to be made so that three antennas 2 and 2' and 2", which are arranged according to axes perpendicular to each other, follow the same path each time the shaft 7 is rotated over 120°. This means that antenna 2 is upward in the situation of FIG. 2, while after the shaft 7 is rotated over a 120°, antenna 2' would be upward, and after a rotation of 240° antenna 2" would be upward. A complete rotation of 360° would bring antenna 2 upward again, equal to the starting position. Such rotation 8 is known as a rotation according to the magic angle, and is not described in further detail.

The probe 1 is connected to a probe interface 5. Depending on the set-up and circumstances of the probe 1, part of the measurement and detection circuit and processing circuit can be arranged in the probe interface 5. The probe interface 5 therefore is considered to be part of the probe 1. The measurement correction being executed in the housing 3 of the probe 1 or in the interface 5 is both considered falling within the principles of the invention and therefore considered within the scope of the claims. The measurement result 6 is an output of the interface 5.

In the test setting of FIG. 2, the source 4 comprises a source antenna 4a and a source frequency generator and amplifier 4b. The source 4 is operationally connected to the probe 1, as is seen by the dotted line between the frequency generator 4b and the probe interface 5. Via this operational connection, information relating to the RF signal is transmitted from the source 4 to the probe 1. In this context, as already stated above, the probe interface 5 forms part of the probe 1. In practice, the source antenna 4a will typically emit and RF signal with a single frequency and a known amplitude. The frequency of the RF signal is communicated by the source 4 to the probe 5.

Figure 3A:
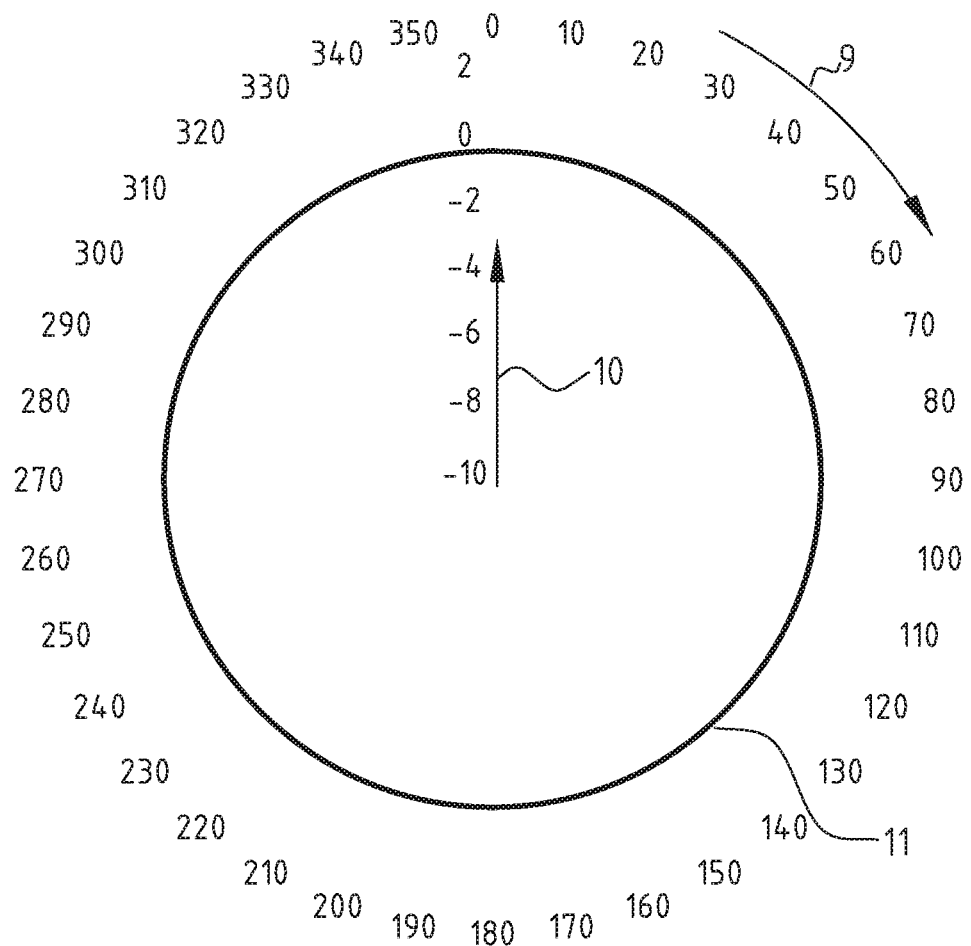
FIGS. 3A and 3B illustrate measurement results obtained with the probe of FIG. 2.

When the probe housing 3 is rotated 8, the amplitude measured by the antennas 2 should preferably look, for an isotropic probe, like shown FIG. 3A. In FIG. 3A, the rotation angle is shown in the periphery 9 while the measured amplitude is shown by the distance from the center point 10. By rotating the probe housing 3, a circular graph 11 is formed. Since the output amplitude of the source 4 is constant, the measured amplitude should be constant as well.

Figure 3B:
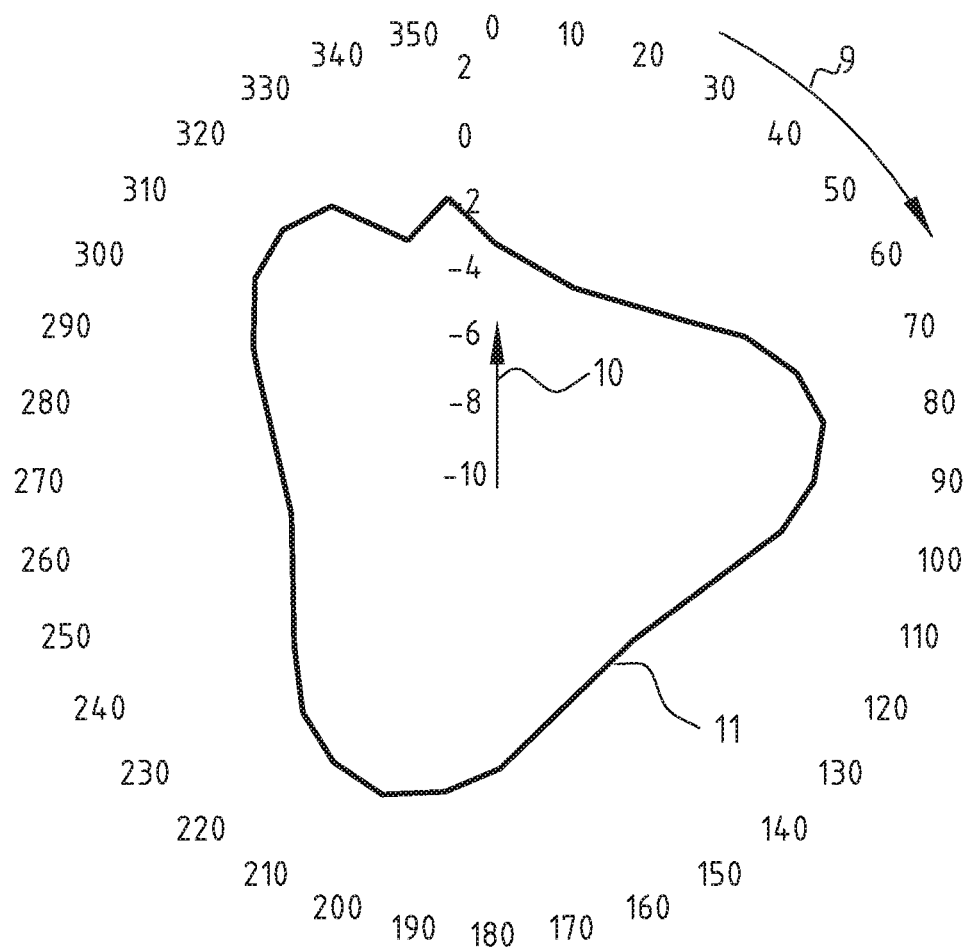

In practice, when such measurement is done, the amplitude output could look like the graph shown in FIG. 3B. FIG. 3B shows a graph wherein the measured amplitude 11' is not constant over the rotation 9, thereby decreasing the isotropic nature of the probe. FIG. 3B shows a triangle shaped graph which results from the three antennas which are located, following the magic angle rotation 120° apart. The graph in FIG. 3B shows that a measurement error and the magnitude of the measurement error can be related to the angular position of the probe 1 relative to the source 4. This knowledge can be used to apply a measurement correction. FIG. 3A shows an ideal situation of an isotropic probe 1. The skilled person will understand how a correction value or a correction mechanism can be applied to go from a measurement of FIG. 3B to an output of FIG. 3A.

The skilled person will understand based on FIG. 2 that by rotating the probe around the shaft 7, the ratio of the amplitude measurements between the different antennas 2, 2' and 2" changes so that based on these ratios, the angular position can be determined. Since the angular position can be determined, the measurement error is known and a corresponding correction can be applied to the measurement result 6. Different techniques may be applied to determine a correction value. Other rotations than the magic angle rotation can be used to determine a relationship between the angular position and the measurement error. The present invention is not limited to a magic angle rotation setup.

Different frequencies used by the source 4 will give different measurement outputs 3B so that different correction values are to be applied to the measurement result. It is noted that the correction can be applied by hardware or software implementation. Furthermore, the correction can be applied in the probe housing 3 or in the probe interface 5. When the correction is applied in the probe interface, the measured amplitudes of the individual antennas are sent to the interface 5, so that the interface 5 can determine the angular position of the probe relative to the source, before applying the correction.

The skilled person will also realize that a correction from a graph as shown in FIG. 3B to a graph as shown in FIG. 3A can be stored in a memory in the form of a look-up table, or in the form of a mathematical formula.

The correction can be implemented in hardware or in software. In both situations, the correction could be applied in the probe housing 3 or in the interface 5. When the interface 5 is inserted in a computer, the computer software directly or indirectly interacting with the interface 5 is considered part of the interface 5 and hence, of the probe 1. The correction can be executed by EMC software running on the computer, communicating with the interface 5. This is considered covered by the scope of the claims.

When the correction is applied in the interface 5, the probe outputs the individual measurements of the antennas, such that the interface 5 can determine an angular position. Alternatively, the probe calculates an angular position and communicates the angular position to the interface so that the interface can apply the correction using this information.

In the context of this description, the word non-coplanar is defined as not lying in a single plane. Two crossing axes define a plane and the third axis shows an angle relative to this plane.

Electronics can be accommodated in the housing as described in WO2009/020388, which is incorporated by reference for this purpose. However, the skilled person will realize that other accommodations can be made. For example, while the incorporated accommodation uses a single set of ranging amplifiers to sequentially amplify the signals from the different antennas, FIG. 3 shows an alternative embodiment wherein each antenna is coupled to its dedicated ranging amplifier.

Antenna 2 used in the present invention can be manufactured as described in WO2009/020388, which is incorporated by reference for this purpose. The skilled person will understand that other antennas can be used that can be operated within the abovementioned broadband range.

Figure 4:
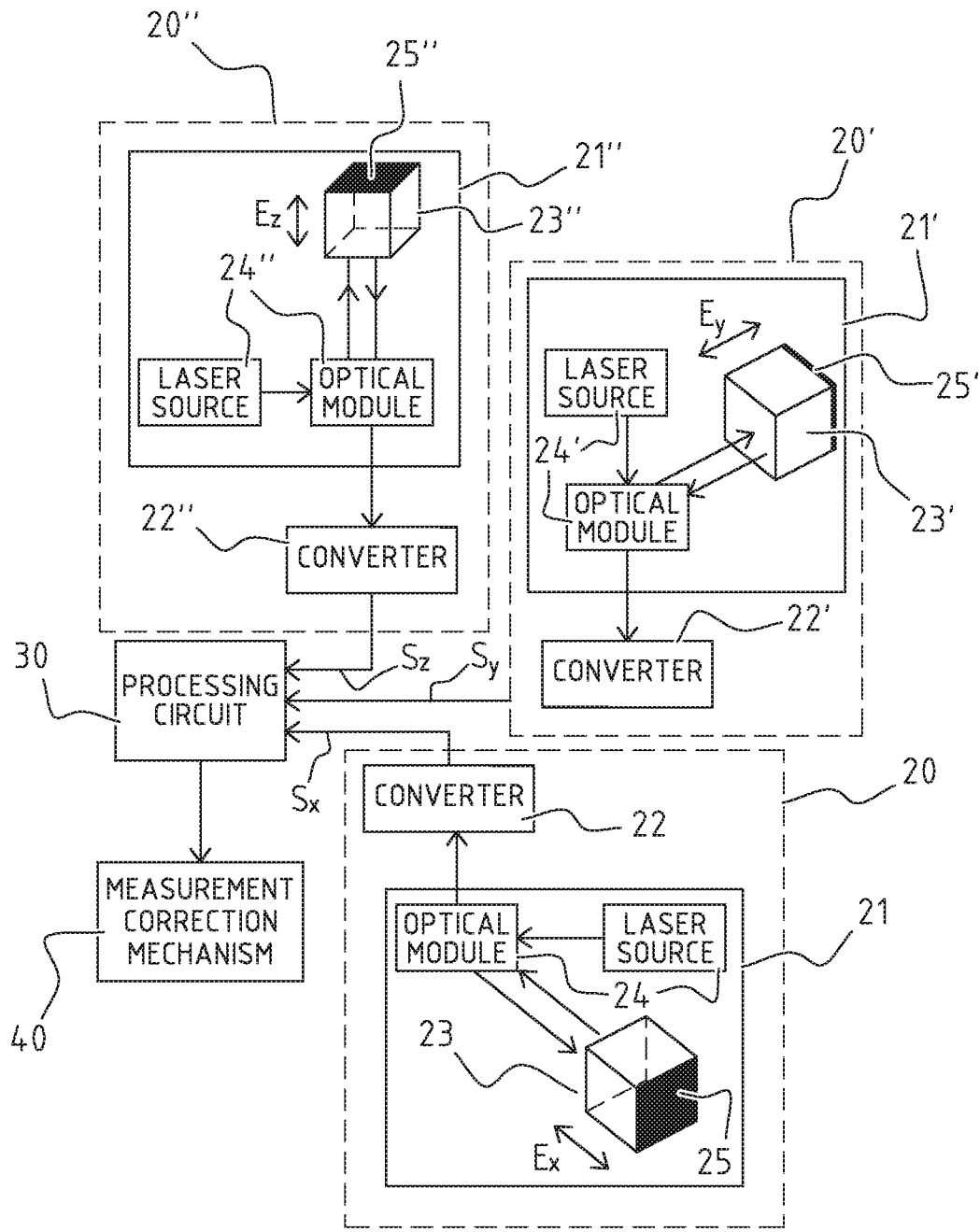
FIG. 4 schematically illustrates another embodiment of a probe system.

FIG. 4 illustrates another embodiment of a probe system for measuring an electrical field. The probe system comprises three sensing means 20, 20', 20" arranged in accordance with three non-coplanar axes X, Y, Z such that three electrical field components along said three non-coplanar axes can be sensed. As will be explained below, it is the crystals of the three sensing means that are positioned such that they can measure electrical field components Ex, Ey, Ez oriented perpendicular with respect to each other. Each sensing means 20, 20', 20" is adapted to sense an electric field component of an RF signal and to output an electric signal Sx, Sy, Sz which is a measure for the respective sensed electric field component Ex, Ey, Ez. A processing circuit 30 is operationally connected to each sensing means 20, 20', 20". The processing circuit 30 is configured for processing the obtained electric signals Sx, Sy, Sz and for outputting a measurement result. A measurement correction mechanism 40 is configured for correcting the measurement result based on a frequency of the electrical field and an angular position of the three sensing means 20, 20', 20" relative to said electrical field. It is noted that the three sensing means 20, 20', 20" may be fixed in a housing in fixed positions with respect to each other.

Preferably each sensing means 20, 20', 20" is adapted to output an electric signal Sx, Sy, Sz representative for an amplitude of the sensed electrical field component Ex, Ey, Ez, and wherein the measurement correction mechanism 40 is configured to use an angular position which is determined based on the three electric signals representative for the three detected amplitudes output by the three sensing means.

Each sensing means 20, 20', 20" comprises an electro-optical probe-element 21, 21', 21" configured for generating an optical signal which is modulated in function of the sensed electrical field component, and a converter 22, 22', 22" configured for converting the optical signal in an electrical signal which is a measure for said sensed electric field component. The electro-optical probe-element 21, 21', 21" comprises a crystal 23, 23', 23" having an optical property, such as a refractive index, which is dependent on the electrical field, and an optical system 24, 24', 24" configured for generating an optical beam, here a laser beam through said crystal 23, 23', 23". The laser beam which has passed through the crystal is reflected back by a mirror 25, 25', 25". The beam leaving the crystal will have different properties, e.g. a modified polarization which can be used to determine characteristics such as the amplitude of the sensed electric field Ex, Ey, Ez. Thus, at the input of the converter 22, 22', 22" there is presented an optical signal which is modulated in function of the sensed electrical field component Ex, Ey, Ez. Instead of a laser source any other suitable light source may be used. Also, the optical system 24, 24', 24" may comprise any suitable optical elements such as a lens and/or a collimator and/or a mirror for guiding the light beam.

The skilled person will appreciate that the invention is not limited to the above described exemplary embodiments and that many modifications and variants are possible without departing from the scope of the invention, wherein the scope of protection is defined solely by the appended claims.

The invention claimed is:

1. A probe system for measuring an electrical field, comprising:
at least three sensing means arranged in accordance with at least three non-coplanar axes such that three electrical field components along said three non-coplanar axes can be sensed; each sensing means being adapted to sense an electric field component of a radio frequency signal and to output an electric signal which is representative of an amplitude of the sensed electric field component;
a processing circuit operationally connected to each sensing means, said processing circuit being configured for processing the obtained electric signals and for outputting a measurement result; and
a measurement correction mechanism comprising a memory, said measurement correction mechanism configured to determine an angular position based on the at least three electric signals representative of the at least three detected amplitudes output by the at least three sensing means, and to correct the measurement result based on a frequency of said electrical field and the angular position of the at least three sensing means relative to said electrical field.

2. The probe system according to claim 1, comprising a probe in which the at least three sensing means are included, wherein the at least three sensing means comprise at least three antennas, each antenna being adapted to receive the radio frequency signal, the at least three antennas being arranged in accordance with at least three non-coplanar axes; and a detection circuit for each antenna, connected to the corresponding antenna for detecting the radio frequency signal; and wherein the processing circuit is operationally connected to an output of each detection circuit for processing the detected signals and outputting the measurement result; and wherein the measurement correction mechanism is configured for correcting the measurement result based on the frequency of said electrical field and the angular position of the probe relative to said electrical field.

3. The probe system according to claim 2, wherein each detection circuit is adapted to detect an amplitude relating to the electrical field received by the corresponding antenna.

4. The probe system according to claim 3, wherein said angular position is determined based on the ratio of the at least three detected amplitudes corresponding to the at least three antennas arranged in accordance with the at least three non-coplanar axes.

5. The probe system according to claim 1, wherein each sensing means comprises an electro-optical probe-element configured for generating an optical signal which is modulated in function of the sensed electrical field component, and a converter configured for converting the optical signal in an electrical signal which is a measure for said sensed electric field component.

6. The probe system according to claim 5, wherein the electro-optical probe-element comprises a crystal having an optical property which is dependent on the electrical field, and an optical system configured for generating an optical beam through said crystal in order to obtain an optical signal which is modulated in function of the sensed electrical field component.

7. The probe system according to claim 1, wherein each sensing means comprises an electro-optical probe-element configured for generating an optical signal which is modulated in function of the sensed electrical field component, and a converter configured for converting the optical signal in an electrical signal which is a measure for said sensed electric field component.

8. The probe system according to claim 7, wherein the electro-optical probe-element comprises a crystal having an optical property, such as a refractive index, which is dependent on the electrical field, and an optical system configured for generating an optical beam through said crystal in order to obtain an optical signal which is modulated in function of the sensed electrical field component.

9. The probe system according to claim 1, wherein the at least three non-coplanar axes comprise three axes oriented perpendicularly to each other.

10. The probe system according to claim 5, wherein the at least three non-coplanar axes comprise three axes oriented perpendicularly to each other.

11. The probe system according to claim 1, wherein the probe system comprises an input for receiving information regarding said frequency.

12. The probe system according to claim 11, wherein said input is adapted to be operationally connected to a source for said electrical field.

13. The probe system according to claim 1, wherein the memory stores a predetermined correction for the measurement result.

14. The probe system according to claim 13, wherein the predetermined correction is stored in a look-up table wherein multiple predetermined corrections are stored for different combinations of said frequency and said angular position.

15. A method for measuring an electrical field, comprising:
    sensing a radio frequency signal by at least three sensing means arranged in accordance with at least three non-coplanar axes such that at least three electrical field components along said at least three non-coplanar axes are sensed; and outputting electric signals which are measures for said sensed at least three electric field components, wherein the outputting comprises each sensing means outputting an electric signal representative of an amplitude of the sensed electrical field component;
    determining an angular position based on the at least three electric signals representative of the at least three detected amplitudes output by the at least three sensing means;
    processing the obtained electric signals and outputting a measurement result; and
    correcting the measurement result based on a frequency of said electrical field and an angular position of the at least three sensing means relative to said electrical field.

16. The method according to claim 15, wherein the at least three sensing means comprise at least three antennas, and wherein:
    the step of sensing and outputting comprises receiving the radio frequency signal by at least three antennas being arranged in accordance with three non-coplanar axes; and detecting the radio frequency signal corresponding to each of the antennas;
    the step of processing comprises processing the detected signals by a processing circuit to output the measurement result; and
    the step of correcting comprises correcting the measurement result based on a frequency of said electrical field and said angular position of the probe relative to said electrical field.

17. A probe system for measuring an electrical field, comprising:
    a probe including at least three antennas, each antenna being adapted to receive a radio frequency signal, the at least three antennas being arranged in accordance with at least three non-coplanar axes, such that three electrical field components along said three non-coplanar axes can be sensed; and a detection circuit for each antenna, connected to the corresponding antenna for detecting the radio frequency signal; wherein each detection circuit is adapted to detect an amplitude relating to the electrical field received by the corresponding antenna; and
    a processing circuit operationally connected to an output of each detection circuit for processing the detected signals, said processing circuit being configured for processing the obtained electric signals and for outputting a measurement result; and
    a measurement correction mechanism comprising a memory, said measurement correction mechanism being configured for correcting the measurement result based on a frequency of said electrical field and an angular position of the probe relative to said electrical field; wherein said angular position is determined based on the ratio of the at least three detected amplitudes corresponding to said at least three antennas.

* * * * *